(12) United States Patent
Chang et al.

(10) Patent No.: US 6,365,506 B1
(45) Date of Patent: Apr. 2, 2002

(54) DUAL-DAMASCENE PROCESS WITH POROUS LOW-K DIELECTRIC MATERIAL

(75) Inventors: Chih-Han Chang, Taipei Hsien; Hsin-Chuan Tsai, Taoyuan, both of (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 09/859,762

(22) Filed: May 17, 2001

(30) Foreign Application Priority Data

Nov. 27, 2000 (TW) .......................................... 89125098

(51) Int. Cl.$^7$ .......................................... H01L 21/4763
(52) U.S. Cl. ........................ 438/624; 438/637; 438/638; 438/687
(58) Field of Search ................................ 438/624, 637, 438/638, 687

(56) References Cited

U.S. PATENT DOCUMENTS 6,071,809 A * 6/2000 Ahao .......................... 438/624
6,184,128 B1 * 2/2001 Wang et al. ................. 438/637
6,245,663 B1 * 6/2001 Zhao et al. .................. 438/622
2001/0002331 A1 * 5/2001 Miyata ........................ 438/637

* cited by examiner

Primary Examiner—John F. Niebling
Assistant Examiner—Lynne H. Gurley
(74) Attorney, Agent, or Firm—Darby & Darby

(57) ABSTRACT

This invention relates to a dual damascene process with porous low-k dielectric material. A first insulating layer is formed on a porous low-k dielectric layer. The first insulating layer has a first pattern for defining a first opening in the low-k dielectric layer. Also, the invention includes the step of forming a second insulating layer on the first insulating layer. Both the first insulating layer and the second insulating layer are used as a hard mask, the two insulating layers being of different materials. The second insulating layer has a second pattern for defining a second opening in the low-k dielectric layer. Then, at least one etch is performed to form a dual damascene structure in the porous low-k dielectric layer by the different insulating layers which cause different protection time in etching the porous low-k dielectric layer.

18 Claims, 7 Drawing Sheets

DUAL-DAMASCENE PROCESS WITH POROUS LOW-K DIELECTRIC MATERIAL

BACKGROUND OF THE INVENTION

1. Field of the Invention

The present invention relates to the fabrication of semiconductor device having a conductive interconnect, and more particularly, to a dual damascene process for conductive interconnects using a porous low-k dielectric material.

2. Description of the Prior Art

The trend of semiconductor processing technique is toward scaling down the dimensions of semiconductor devices such as integrated circuits (IC). The scaling-down of IC dimensions, however, requires an increase of the number of interconnect levels and interconnect wiring with minimum pitch. As the IC is scaled down, metallization, which interconnects devices on the IC, is also scaled down. It has been well recognized in the semiconductor industry that damascene process and its twin, dual-damascene process, are promising technologies for fabricating metal lines and interconnects in IC. Furthermore, the dual damascene process will be broadly applied in the fabrication process of ultra large semiconductor integration (ULSI) interconnects beyond 0.18 um technology. The greatest advantage of the dual damascene process is that the metal lines are not etched, but deposited in trench lines and via holes etched away with one etching step or a series of etching steps within the dielectric layer, and then excess metal is removed by polish. In principle, there are two standard modes of the dual damascene techniques, namely, via-first and trench-first.

Referring to FIG. 1, ICs typically include multi-level metallization. A first metal line 11 is contained within a first trench line 13 etched in a first trench insulating layer 15. A second metal line 12 is contained within a second trench line 14 etched in a second trench insulating layer 16. The first metal line 11 is on a first metallization level on the IC, and the second metal line 12 is on a second metallization level on the IC. A via interconnects the metal lines 11 and 12 on the two different metallization levels. A via plug 17 is comprised of a conductive material and is deposited within a via hole 18 etched in a via insulating layer 19. The insulating layers 15, 16 and 19 are comprised of any insulating material such as oxide as is known to one of ordinary skill in the art.

Silicon dioxide with a dielectric constant (k) around 3.9 to 4.1 has been widely used in the semiconductor industry to insulate individual wires and circuits. With the increased integration density, the use of $SiO_2$ with constant thickness is more and more difficult and costly. Advanced materials are expected to provide a low-k material with k value below 3, and even to develop porous materials with ultralow-k under 2.5. Ultralow-k dielectric materials, such as XLK of Dow Corning Corporation, are porous and less robust. With such a porous material, the via-first and trench-next dual damascene technique can not be processed because the subsequent resist or BARC for gap-filling will be absorbed into the pores or voids of the ultralow-k dielectric materials.

Referring to FIG. 2A, a prior art dual damascene process with ultralow-k dielectric is disclosed, including a step of depositing a bottom nitride layer 22 on a first metal layer 21. A via insulating layer of ultralow-k dielectric material 23 is deposited on the bottom nitride layer 22. A via masking layer 24 is deposited on the via insulating layer 23. The via masking layer 24 is etched to have a via pattern for defining a via hole in the via insulating layer 23. The via masking layer 24 typically is comprised of a hard mask material such as nitride.

A trench insulating layer of ultralow-k dielectric material 25 is deposited on the via masking layer 24. A trench masking layer 26 is deposited on the trench insulating layer 25. The trench masking layer 26 is comprised of a hard mask material such as nitride. Then, a trench pattern is etched into the trench masking layer 26 using a photoresist layer 27, as is known to one of ordinary skill in the art of IC fabrication so that the size, shape and location of a trench line 28 are defined.

Referring to FIG. 2B, the photoresist layer 27 is removed before the dual damascene process for forming the trench line 28 and a via hole 29. Referring to FIG. 2C, the trench line 28 and the via hole 29 is etched by the dual damascene etch.

Referring to FIG. 2D, any exposed masking layers 24 and 26 (and the nitride layer 22) are etched away before the via hole 29 and the trench line 28 are filled with conductive material. The trench masking layer 26 is aligned with the via masking layer 24 such that the trench line 28, defined by the trench pattern, is contiguous with the via hole 29, defined by the via pattern. Thus, the first conductive material filled within the via hole 29 forms a conductive path with the second conductive layer filled within the trench line 28, as illustrated in FIG. 1.

Those of ordinary skill in the art know that the first conductive material filled within the via hole 29 and the second conductive material filled within the trench line 28 may be the same type of conductive material, or alternatively, different conductive material. They may be aluminum or copper, or any other conductive material known to one of ordinary skill in the art to be used for IC fabrication.

With the prior art dual damascene etch of FIG. 2, because the insulting layers of ultralow-k dielectric materials 23 and 25 are deposited respectively, the process appears complicated. Furthermore, the via masking layer 24 used as an etching stop in the dual damascene etch has a high k value. Such a masking layer when in cooperation with a ultralow-k dielectric will significantly increase the capacitance between the first metal layer 21 and the second metal layer filled within the trench line 28, and hence, on-chip speed is decreased.

SUMMARY OF THE INVENTION

It is therefore an object of the invention to provide a dual damascene process. In the dual damascene process according to the invention, the disadvantages of the conventional process are improved upon.

Another object of the invention is to provide integration of porous low-k dielectric materials with the dual damascene process to prevent from direct contact with the photoresist which is deposited thereon subsequently and generally contains poisonous composition such as moisture for low-k dielectrics.

To achieve these objects and advantages, and in accordance with the purpose of the invention, as embodied and broadly described herein, the invention is directed towards a dual damascene process with porous low-k dielectric. A first insulating layer is formed on a porous low-k dielectric layer. The first insulating layer has a first pattern for defining a first opening in the low-k dielectric layer. Also, the invention includes the step of forming a second insulating layer on the first insulating layer. Both the first insulating layer and the second insulating layer are used as a hard mask, the two insulating layers being of different materials. The second insulating layer has a second pattern for defining a second opening in the low-k dielectric layer. Then, at least one etch is performed to form a dual damascene structure in the porous low-k dielectric layer by the different insulating layers which cause different protection time in etching the porous low-k dielectric layer.

BRIEF DESCRIPTION OF THE DRAWINGS

These and other features and advantages of the present invention will be better understood by considering the following detailed description of the invention which is presented with the attached drawings.

FIG. 2, including

FIG. 3, including

FIG. 4, including

DESCRIPTION OF THE PREFERRED EMBODIMENTS

Figure 1:
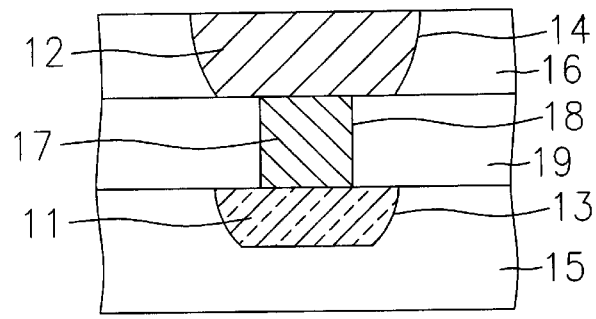
FIG. 1 shows a cross-section of multi-level metallization in an integrated circuit including a via for interconnecting metal lines on different levels.
Figure 2A:
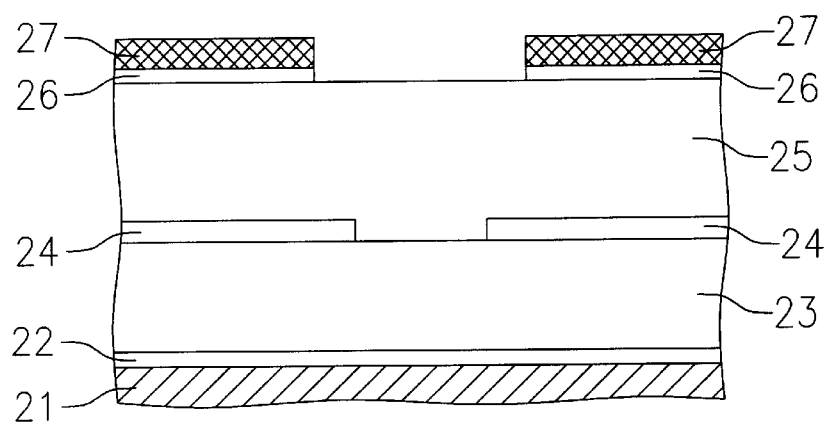
FIGS. 2A, 2B, 2C and 2D, shows cross-section views depicting the steps of a dual damascene process for etching a via hole and a trench line, according to the prior art.
Figure 2B:
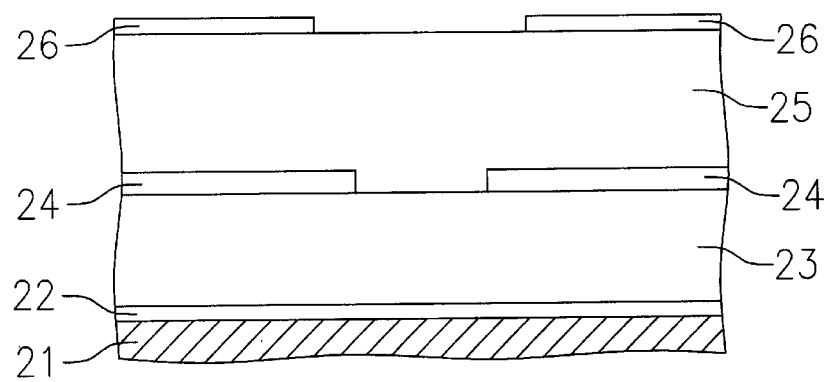
Figure 2C:
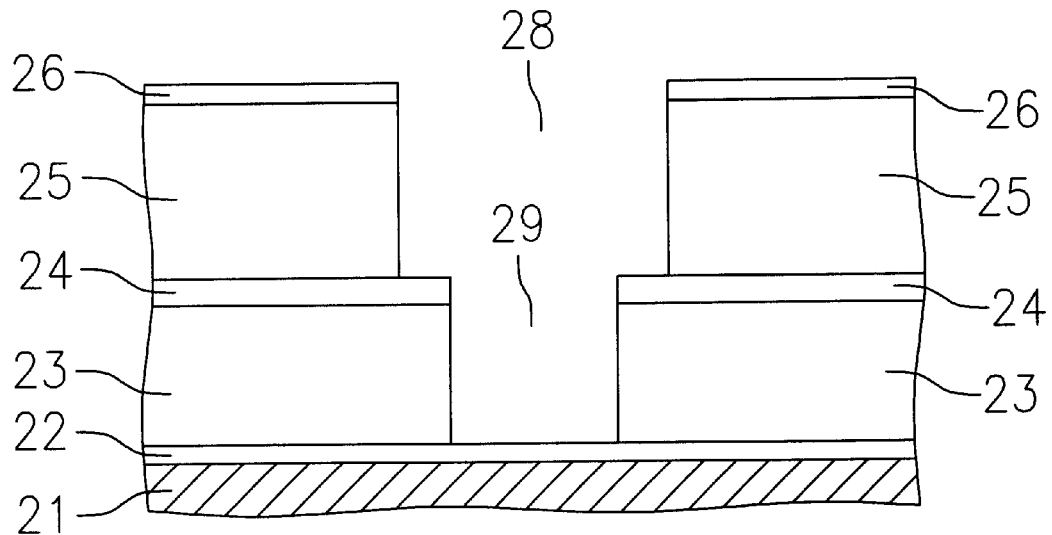
Figure 2D:
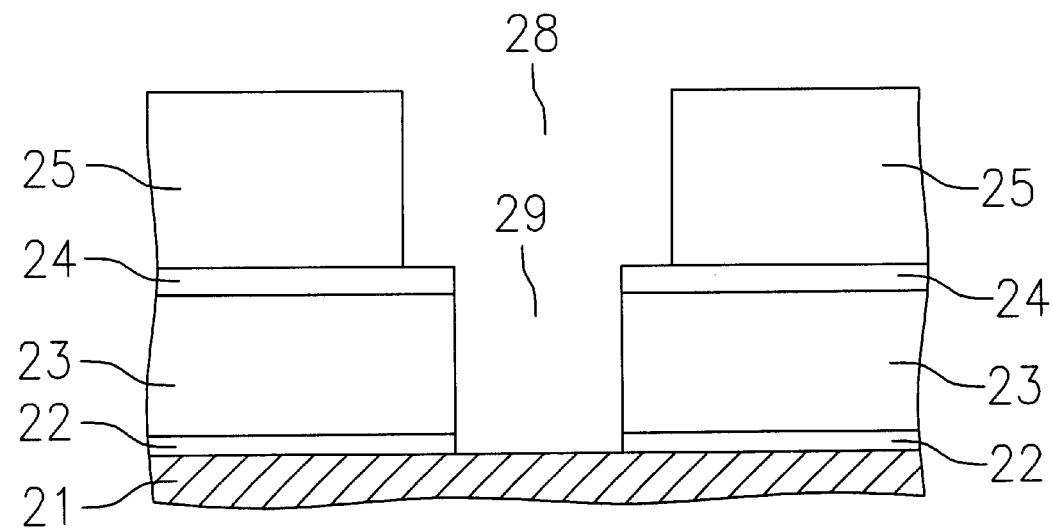
Figure 3A:
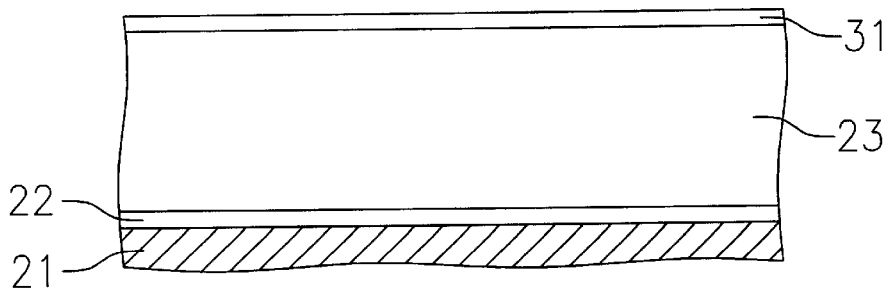
FIGS. 3A, 3B, 3C, 3D, 3E, 3F, 3G and 3H, shows cross-section views depicting the steps of a porous low-k dual damascene process for etching a via hole and a trench line, according to the present invention.
Figure 3B:
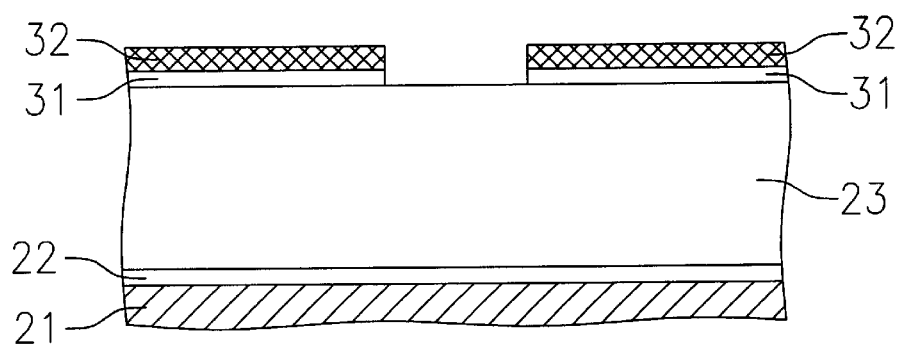

Referring now to FIG. 3A (with same reference numerals as FIG. 2 for elements having similar structure and function), a via insulating layer 31 is deposited on the ultralow-k dielectric layer 23 having a thickness, for example 7,000 angstroms to 10,000 angstroms. The via insulating layer 31 is comprised of a hard mask, having a via pattern for defining the via holes 29. The hard mask layer 31 is formed by for example a PECVD process. A preferable hard mask layer 31 includes silicon carbide having a thickness not more than 300 angstroms. Referring to FIG. 3B, the via pattern is etched into the via masking layer 31 using a photoresist layer 32, as is known to one of ordinary skill in the art of IC fabrication.

Figure 3C:
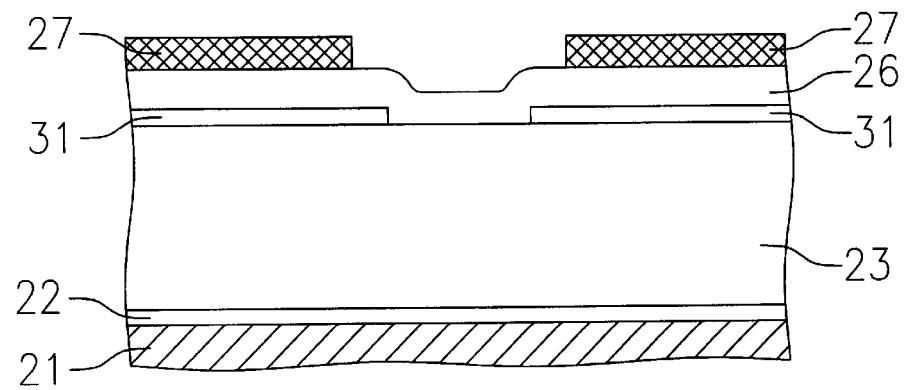
Figure 3D:
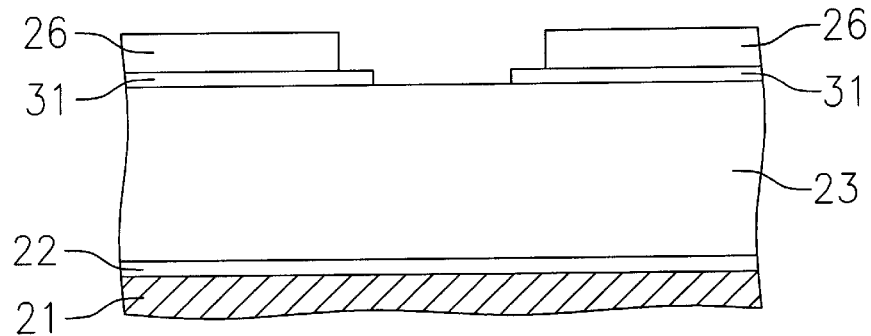

Referring to FIG. 3C, the trench insulating layer 26 is deposited on the hard masking layer 31 after removing the photoresist layer 32. The trench insulating layer 26 is comprised of a hard mask, having trench pattern for defining the trench line 28. Note that the material of the trench masking layer 26 is different from that of the via masking layer 31. The trench masking layer is formed by for example a PECVD process. A preferable hard mask layer 26 includes silicon nitride having a thickness of about 1,000 angstroms to 2,000 angstroms. Referring to FIG. 3D, the trench pattern is etched into the trench masking layer 26 using a photoresist layer 27, as is known to one of ordinary skill in the art of IC fabrication.

Figure 3E:
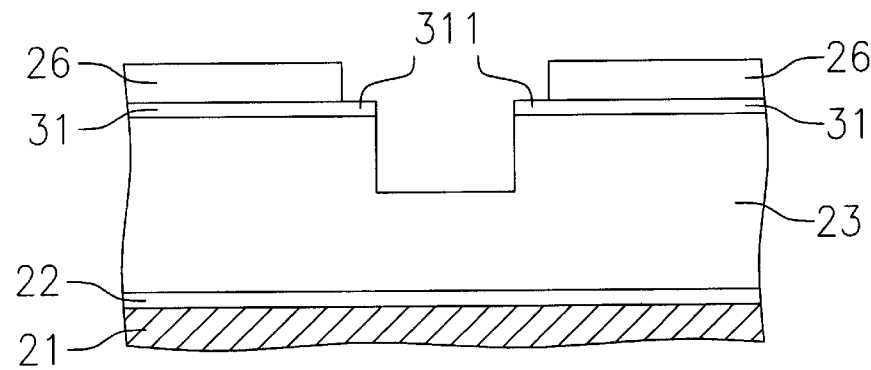
Figure 3F:
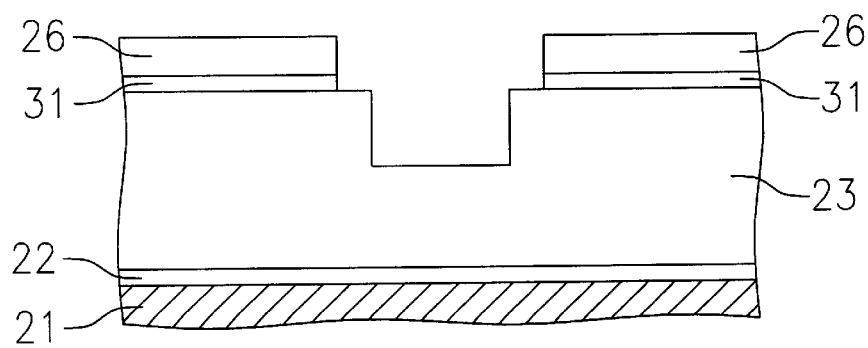
Figure 3G:
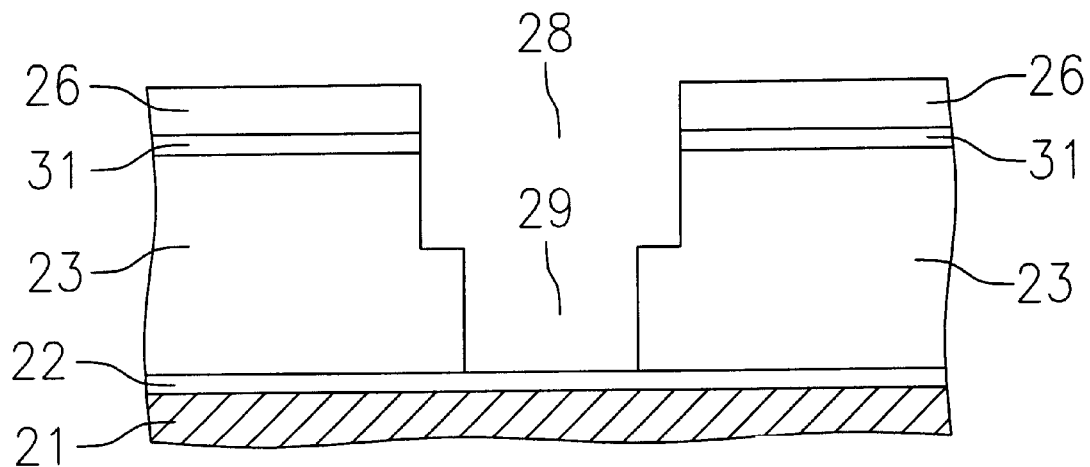

Before the dual damascene process, the photoresist layer 27 is removed, as shown in FIG. 3E and FIG. 3F. The ultralow-k dielectric layer 23 is effectively etched in $Ar/CF_4/CHF_3$ etch chemistry which is highly selective with respect to via insulating layer 31. A groove 33 having the same width as the via hole 29 is formed within the ultralow-k dielectric layer 23 and parts 311 of via masking layer 31 exposed to the trench masking layer 26 is removed with one etching step or two etching steps. Then, the trench insulating layer 26 is effectively etched again in $Ar/CF_4/CHF_3$ etch chemistry which is low selective with respect to via insulating layer 31, and the bottom silicon nitride layer 22 serves as an etch stop for this etching step. Thus, with the present dual damascene process, the via hole 29 and the trench line 30 are formed, as shown in FIG. 3G.

Figure 3H:
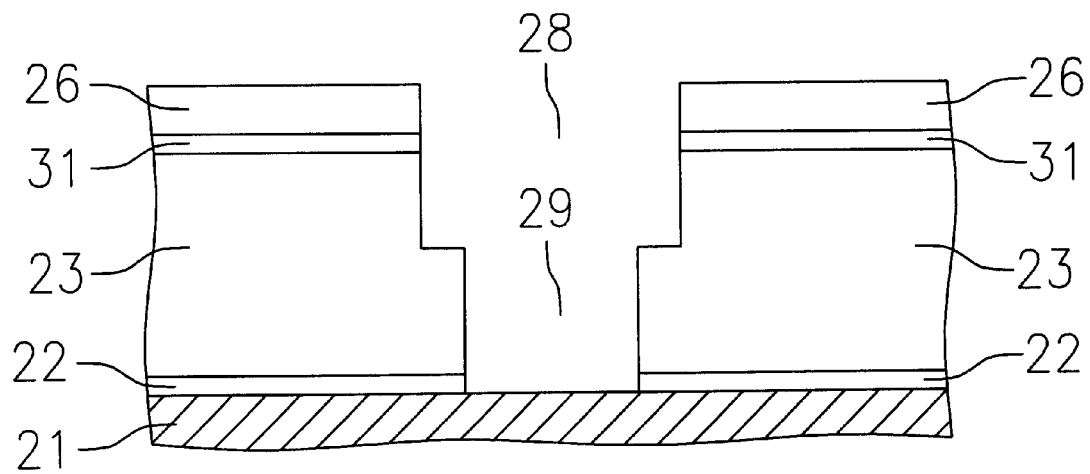

Before filling a conductive material with the via hole 29 and the trench line 28, the exposed bottom silicon nitride 22, together with some of the trench masking layer 26, is removed by any of the etching methods well known to those of ordinary skill in the art, as shown in FIG. 3H.

Figure 4A:
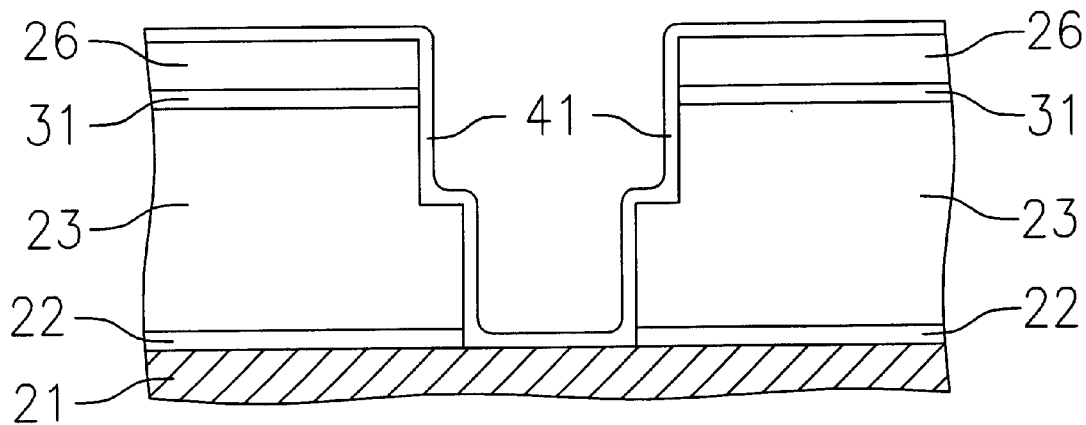
FIGS. 4A, 4B, 4C and 4D, shows cross-section views depicting the steps of embodying the present invention with a conductive interconnection material.

Integration of the present invention with copper interconnect has proven to be capable of significantly reducing is the interconnect RC loading effect and tremendously improving signal delay. Referring to FIG. 4A, in the back end of a line process of copper dual damascene, a thin barrier layer 41 having a thickness of about 100 angstroms to 500 angstroms is deposited on top of the trench masking layer 26, including the sidewalls of the via hole 29 and the trench line 28 and the via hole bottom adjacent the first metal layer 21, by PVD or CVD method to prevent the copper from diffusing into the dielectric 23 which causes short circuits in the adjacent metal 21. Tantalum or tantalum nitride is known to be the optimum manufacturable barrier.

Figure 4B:
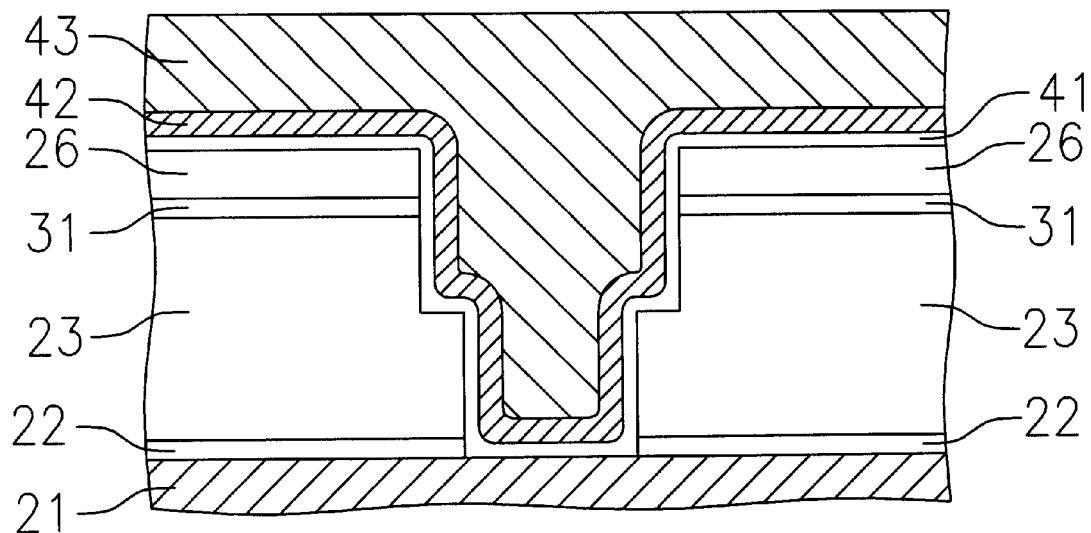
Figure 4C:
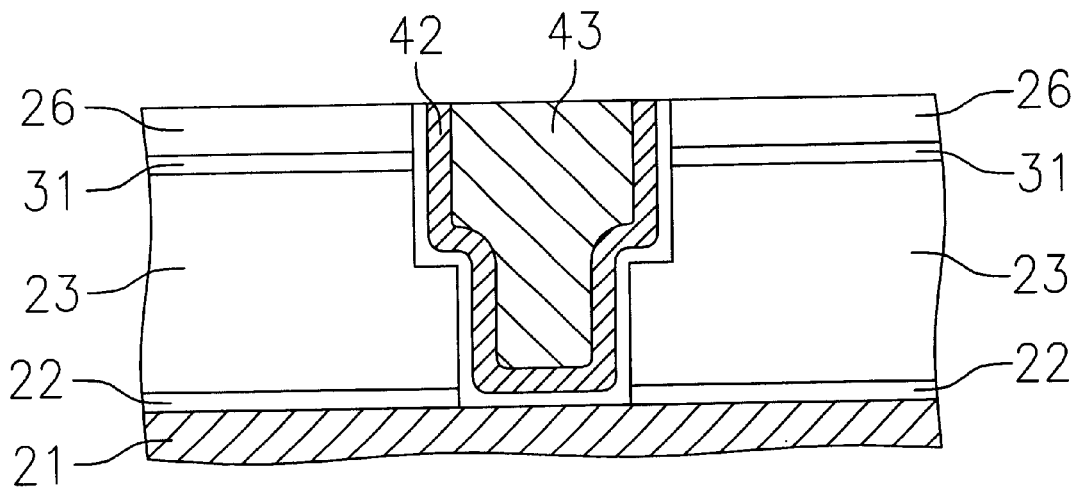
Figure 4D:
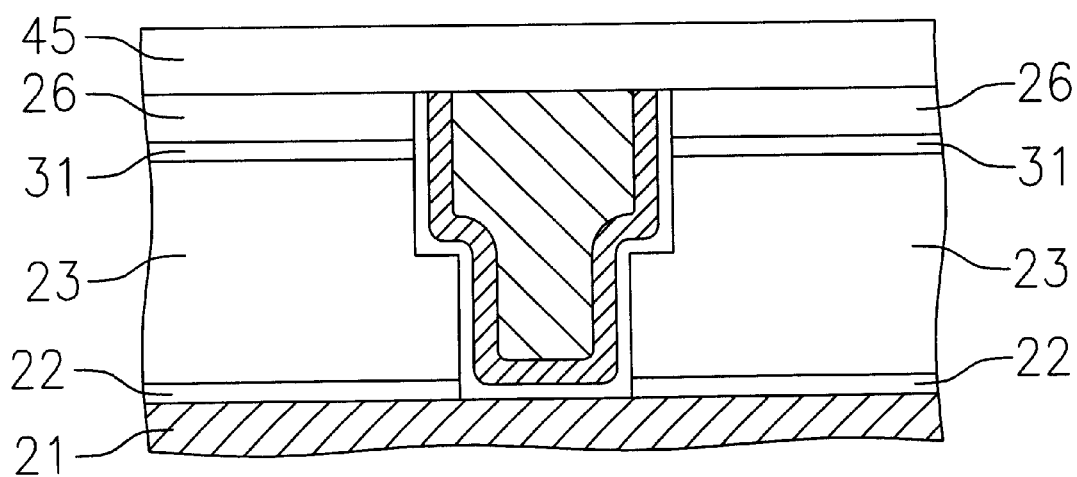

Thereafter, a thin and continuous copper seed layer 42, typically 200 angstroms to 1,000 angstroms thick, is deposited immediately on the barrier layer 41 by PVD or CVD method to allow the correct grain growth during the subsequent bulk copper 43 deposition step, as shown in FIG. 4B. The deposition of copper 43 is preferably formed by ECP (electrical-chemical plating). Referring to FIG. 4C, excess coppers 42,43 and the barrier layer 41 are removed preferably by CMP (chemical mechanical polish), using the remaining masking layer 26 or 31 as a stop layer. Then, a cap layer 45 is deposited on the top of copper 43 to complete the copper interconnect, as shown in FIG. 4D. The cap layer 45 may be formed of silicon nitride.

Additional advantages and modifications will readily occur to those skilled in the art. Therefore, the invention in its broader aspect is not limited to the specific details and illustrated example shown and described herein.

What is claimed is:

1. A dual damascene process with porous low-k dielectric, comprising:
    a) providing a porous low-k dielectric layer;
    b) depositing a first hard mask on said porous low-k dielectric layer;
    c) depositing a first photoresist layer on said first hard mask to define a first opening;
    d) removing said first photoresist layer and depositing a second hard mask on said first mask layer on which said first opening is defined, said second hard mask being of different material from said first hard mask;
    e) depositing a second photoresist layer on said second hard mask to define a second opening;
    f) removing said second photoresist layer;
    g) etching said porous low-k dielectric layer to form a groove having the same width as said first opening and removing parts of said first hard mask exposed to said second hard mask within said second opening; and
    h) etching again to form a dual damascene structure having said first opening and second opening within said porous low-k dielectric layer.

2. The process of claim 1, wherein the dielectric constant of said porous low-k dielectric layer is less than 2.5.

3. The process of claim 1, wherein said first hard mask is much thinner than said second hard mask.

4. The process of claim 1 or 3, wherein said first hard mask comprises silicon carbide.

5. The process of claim 4, wherein the thickness of said first hard mask is not more than 300 angstroms.

6. The process of claim 1 or 3, wherein said second hard mask comprises silicon nitride.

7. The process of claim 6, wherein the thickness of said second hard mask is about 1,000 angstroms to 2,000 angstroms.

8. The process of claim 1, wherein said first opening is a via hole while said second opening is a trench line.

9. A copper dual damascene process with porous low-k dielectric, comprising:
   a) providing an insulating layer on a semiconductor substrate having an electrical feature;
   b) depositing a porous low-k dielectric layer on said insulating layer;
   c) depositing a first hard mask on said porous low-k dielectric layer;
   d) depositing a first photoresist layer on said first hard mask to define a first opening;
   e) removing said first photoresist layer and depositing a second hard mask on said first mask layer on which said first opening is defined, said second hard mask being of different material from said first hard mask;
   f) depositing a second photoresist layer on said second hard mask to define a second opening;
   g) removing said second photoresist layer;
   h) etching said porous low-k dielectric layer to form a groove having the same width as said first opening and removing parts of said first hard mask exposed to said second hard mask within said second opening;
   i) etching again to form a dual damascene structure having said first opening and second opening within said porous low-k dielectric layer;
   j) removing part of said insulating layer exposed in said first opening on said semiconductor substrate;
   k) depositing a barrier layer;
   l) forming at least one layer of copper;
   m) polishing said copper and barrier layers using said hard mask as a polish stop; and
   n) depositing a cap layer.

10. The process of claim 9, wherein the dielectric constant of said porous low-k dielectric layer is less than 2.5.

11. The process of claim 9, wherein said first hard mask is much thinner than said second hard mask.

12. The process of claim 9 or 11, wherein said first hard mask comprises silicon carbide.

13. The process of claim 12, wherein the thickness of said first hard mask is not more than 300 angstroms.

14. The process of claim 9 or 11, wherein said second hard mask comprises silicon nitride.

15. The process of claim 14, wherein the thickness of said second hard mask is about 1,000 angstroms to 2,000 angstroms.

16. The process of claim 9, wherein said first opening is a via hole while said second opening is a trench line.

17. The process of claim 9, wherein said barrier layer is deposited on said second hard mask, the sidewalls of said first opening and said second opening and the bottom of said first opening adjacent the conductive layer of said substrate.

18. The process of claim 9 or 17, wherein said barrier layer comprises tantalum or tantalum nitride.

* * * * *